United States Patent
Xie et al.

(10) Patent No.: US 11,555,833 B2
(45) Date of Patent: Jan. 17, 2023

(54) SYSTEM, MOTOR VEHICLE

(71) Applicant: Robert Bosch GmbH, Stuttgart (DE)

(72) Inventors: Fei Xie, Gemmrigheim (DE); Rafael Benzler, Kirchberg (DE); Volker Weeber, Lauffen A. N. (DE)

(73) Assignee: Robert Bosch GmbH, Stuttgart (DE)

( * ) Notice: Subject to any disclaimer, the term of this patent is extended or adjusted under 35 U.S.C. 154(b) by 14 days.

(21) Appl. No.: 17/164,335

(22) Filed: Feb. 1, 2021

(65) Prior Publication Data

US 2021/0247423 A1 Aug. 12, 2021

(30) Foreign Application Priority Data

Feb. 11, 2020 (DE) .......................... 102020201657.7

(51) Int. Cl.
*G01R 31/52* (2020.01)
*G01R 15/20* (2006.01)
*B60R 16/03* (2006.01)
*B60R 16/023* (2006.01)

(52) U.S. Cl.
CPC ........ *G01R 15/205* (2013.01); *B60R 16/0231* (2013.01); *B60R 16/03* (2013.01); *G01R 31/52* (2020.01)

(58) Field of Classification Search
CPC ............ G01R 31/50–72; G01R 31/007; B60R 16/00–06
See application file for complete search history.

(56) References Cited

U.S. PATENT DOCUMENTS

| | | | | |
|---|---|---|---|---|
| 4,385,283 | A * | 5/1983 | Delapierre | G01R 31/54 340/642 |
| 2011/0316533 | A1* | 12/2011 | Ausserlechner | G01R 33/09 324/252 |
| 2013/0241563 | A1* | 9/2013 | Heise | B60T 7/085 324/415 |
| 2014/0142879 | A1* | 5/2014 | Lucchese | G01R 19/10 702/64 |
| 2015/0109077 | A1* | 4/2015 | Tomimbang | H02H 3/10 335/7 |
| 2016/0370411 | A1* | 12/2016 | Bruwer | G01D 5/24 |

(Continued)

FOREIGN PATENT DOCUMENTS

| | | | | |
|---|---|---|---|---|
| BR | 102015011124 A2 | * | 11/2015 | ........... G01R 31/025 |
| CN | 102809682 A | * | 12/2012 | ........... G01R 15/205 |

(Continued)

*Primary Examiner* — Patrick Assouad
*Assistant Examiner* — Demetrius R Pretlow
(74) *Attorney, Agent, or Firm* — Norton Rose Fulbright US LLP; Gerard Messina

(57) ABSTRACT

A system having a control unit, which has a housing in which at least one processing unit of the control unit is situated. The system further includes an electrical ground connection situated outside the housing; a first ground line by which the control unit and the ground connection are electrically connected; a second ground line by which the control unit and the ground connection are electrically connected; and a sensor device, which is developed to monitor an electrical first ground current flowing through the first ground line and an electrical second ground current flowing through the second ground line. The sensor device has an XMR sensor for monitoring the first and the second ground current.

9 Claims, 2 Drawing Sheets

(56) References Cited

U.S. PATENT DOCUMENTS

| | | | |
|---|---|---|---|
| 2017/0317500 A1* | 11/2017 | Kumar | H02H 3/16 |
| 2018/0045767 A1* | 2/2018 | Daigle | G01R 35/00 |
| 2018/0203054 A1* | 7/2018 | Romero | G01R 31/007 |
| 2018/0238938 A1* | 8/2018 | Feucht | G01R 35/005 |
| 2018/0315573 A1* | 11/2018 | Curtis | G08B 5/38 |
| 2019/0111786 A1* | 4/2019 | Qian | B60L 53/16 |
| 2019/0128945 A1* | 5/2019 | Cho | G01R 31/007 |
| 2019/0339337 A1* | 11/2019 | Sharma | G01R 33/098 |
| 2020/0101847 A1* | 4/2020 | Tofilescu | G01R 1/203 |
| 2020/0156477 A1* | 5/2020 | Hansen | G01R 27/025 |
| 2020/0241050 A1* | 7/2020 | Camacho | G01R 15/202 |
| 2021/0063495 A1* | 3/2021 | Curtis | G01R 31/54 |
| 2021/0270911 A1* | 9/2021 | Kageyama | G01R 31/083 |

FOREIGN PATENT DOCUMENTS

| | | | | |
|---|---|---|---|---|
| CN | 107436407 A | * | 12/2017 | G01K 7/38 |
| DE | 102012200067 A1 | * | 7/2013 | B60R 16/03 |
| DE | 102012223877 A1 | * | 6/2014 | G01R 31/006 |
| GB | 2218817 A | * | 11/1989 | G01R 1/06766 |
| JP | 2020022251 A | * | 2/2020 | G01R 31/083 |
| WO | WO-2009112412 A1 | * | 9/2009 | G01R 15/205 |
| WO | WO-2016105551 A1 | * | 6/2016 | G01R 31/02 |
| WO | 2017003057 A1 | | 1/2017 | |
| WO | WO-2017221453 A1 | * | 12/2017 | G01R 27/2611 |

* cited by examiner

SYSTEM, MOTOR VEHICLE

CROSS REFERENCE

The present application claims the benefit under 35 U.S.C. § 119 of German Patent Application No. DE 102020201657.7 filed on Feb. 11, 2020, which is expressly incorporated herein by reference in its entirety.

FIELD

The present invention relates to a system, which has a control unit including a housing in which at least one processing unit of the control unit is situated; an electrical ground connection situated outside the housing; a first ground line by which the control unit and the ground connection are electrically connected; a second ground line by which the control unit and the ground connection are electrically connected; and a sensor device, which is designed to monitor an electrical first ground current flowing through the first ground line and an electrical second ground current flowing through the second ground line.

In addition, the present invention relates to a motor vehicle having such a system.

BACKGROUND INFORMATION

Control units are used, for example, in motor vehicles in order to carry out one or more control operations for the control of a motor vehicle. A control unit normally has at least one processing unit for this purpose, which is situated in a housing of the control unit. To discharge electrical currents, the control unit is usually electrically connected to an electrical ground connection situated outside the housing.

The PCT Patent Application No. WO 2017 008 057 A1, for instance, describes a control unit which is electrically connected by two redundant ground lines to a ground connection. Thus, a first ground line is provided by which the control unit and the ground connection are electrically connected, and a second ground line is provided by which the control unit and the ground connection are electrically connected. Electrical currents are therefore discharged in a particularly safe manner. In order to monitor the ground lines, a sensor device, which is developed to monitor an electrical first ground current flowing through the first ground line and an electrical second ground current flowing through the second ground line, is allocated to the ground lines. The control unit, the ground connection, the ground lines and the sensor device jointly form a system of the type mentioned in the introduction. By monitoring the ground currents, it is possible to determine, for instance, whether a malfunction of the ground lines is present such as a ground interruption of one of the ground lines.

The sensor device described in PCT Patent Application No. WO 2017 008 057 A1 has a plurality of shunt components as well as a plurality of comparators for monitoring the ground currents.

SUMMARY

A system according to an example embodiment of the present invention may have the advantage that the control unit is able to be developed in a compact manner. According to an example embodiment of the present invention, the sensor device includes an XMR sensor for monitoring the first and the second ground currents. An XMR sensor is therefore provided which is designed to monitor the first and the second ground currents. As a result, the sensor is developed in a compact and space-saving manner. In particular, a comparator, which normally requires a relatively large space, is not necessary for the design of the sensor device. The sensor device is preferably developed without a comparator. An XMR sensor is to be understood as a sensor which, as a sensor element, has at least one magnetoresistive resistor element, i.e. a resistor element whose electrical resistance is influenced by magnetic fields in the region of the resistor element. The XMR sensor preferably has a plurality of such magnetoresistive resistor elements. A change in the first ground current causes a change in a first magnetic field surrounding the first ground line. Accordingly, a change in the second ground current causes a change in a second magnetic field surrounding the second ground line. To monitor the ground currents, the XMR sensor is situated adjacent to the ground lines in such a way that a change in the first magnetic field and/or a change in the second magnetic field has an effect on the resistance of the magnetoresistive resistor element or on the resistances of the magnetoresistive resistor elements. The resistance or the resistances is/are therefore indirectly influenced by the change in the ground currents. In other words, the XMR sensor utilizes a magnetoresistive effect for monitoring the ground currents, e.g., the anisotropic magnetorestrictive effect (AMR effect), the giant magnetoresistive effect (GMR effect), the colossal magnetoresistive effect (CMR effect), the tunnel magnetoresistive effect (TMR effect), or the planar Hall effect. The ground lines are preferably electrically connected to a star ground of the control unit. The ground lines are therefore connected in parallel with one another to the star ground and connected in parallel with one another to the ground connection situated outside the housing. As a result, the ground lines as a whole are switched in parallel with one another in order to connect the control unit to the ground connection in a redundant manner. Because the ground connection is situated outside the housing, the ground lines also extend at least regionally outside the housing. A resistance value of the first ground line preferably corresponds at least essentially to a resistance value of the second ground line so that the ground currents have the same current value, at least in the absence of a malfunction of the ground lines. With regard to the flow directions of the ground currents, it is assumed that the ground currents are flowing from the control unit to the ground connection.

According to one preferred embodiment of the present invention, it is provided that the XMR sensor has a measuring bridge which includes a first, a second, a third, and a fourth magnetoresistive resistor element. In this way it is possible that homogeneous external magnetic fields, that is to say, magnetic fields that are not induced by a change in the ground currents, do not have an adverse effect on the monitoring of the ground currents. Particularly precise monitoring of the ground currents is achieved in this way. The measuring bridge is preferably developed as a Wheatstone bridge. The resistor elements are preferably developed as resistor elements of the spin valve type. For this purpose, the resistor elements preferably have at least one layer made from a magnetically soft material and at least one layer made from a magnetically hard material.

The resistor elements are preferably identically designed. In the absence of magnetic fields acting on the resistor elements, the resistor elements thus have the same electrical resistance. This simplifies the evaluation of measured data acquired by the XMR sensor in terms of software.

According to one preferred embodiment of the present invention, it is provided that the measuring bridge has a first conductor and a second conductor, the conductors being electrically connected in parallel with each other to an input of the measuring bridge, and are electrically connected in parallel with each other to an output of the measuring bridge, the first conductor having the first resistor element adjacent to the input and having the third resistor element adjacent to the output, and the second conductor having the second resistor element adjacent to the input and having the fourth resistor element adjacent to the output. The input is to be understood as the part of the measuring bridge via which the measuring bridge is electrically connected to a supply line. The output is to be understood as the particular part of the measuring bridge by which the measuring bridge is electrically connected to a ground node. The potential difference between the input and the output is referred to as the supply voltage.

Preferably, the system has an evaluation unit, which is designed to acquire a bridge voltage of the measuring bridge and to determine as a function of the bridge voltage whether the first and/or the second ground line has/have a ground interruption. If a ground interruption of one of the ground lines is present, then the control device and the ground connection are no longer electrically connected by the affected ground line, which means that no ground current is able to flow through this ground line. Thus, the control unit is then no longer redundantly connected to the ground connection. In this state the discharging of electrical currents is restricted and the control unit should not be used for carrying out control operations. The assessment as to whether or not a ground interruption exists is therefore particularly relevant for the safe execution of control operations. Denoted as a bridge voltage is a potential difference between a first section of the first conductor situated between the first resistor element and the third resistor element on the one hand, and a second section of the second conductor situated between the second resistor element and the fourth resistor element on the other hand. Preferably, the first section is connected to a first analog-to-digital converter of the evaluation unit by a first signal line. The second section is preferably connected to a second analog-to-digital converter of the evaluation unit by a second signal line.

According to one preferred embodiment of the present invention, the first and the fourth resistor elements are situated adjacent to the first ground line in such a way that a resistance of the first resistor element and a resistance of the fourth resistor element are affected by a change in the first ground current, and the second and the third resistor elements are situated adjacent to the second ground line in such a way that a resistance of the second resistor element and a resistance of the third resistor element are affected by a change in the second ground current. The first resistor element and the fourth resistor element are thus allocated to the first ground line. The second resistor element and the third resistor element are allocated to the second ground line. The resistance of the first resistor element and the resistance of the fourth resistor element are preferably affected only by the change in the first ground current and not by the change in the second ground current. Preferably, the resistance of the second resistor element and the resistance of the third resistor element are affected only by the change in the second ground current and not by the change in the first ground current.

According to one preferred embodiment of the present invention, the first and the fourth resistor elements are developed in such a way that a change in the first ground current affects the resistance of the first and the fourth resistor element to the same degree, and the second resistor element and the third resistor element are developed in such a way that a change in the second ground current affects the resistance of the second and the third resistor element to the same degree. Using the example of the first and the fourth resistor element, this means that both resistor elements are developed either in such a way that an increase in the first ground current increases the resistances of the resistor elements, or in such a way that an increase in the first ground current reduces the resistances of the resistor elements. This is preferably achieved by a suitable orientation of the magnetically soft and the magnetically hard layers of the resistor elements. Such a design of the sensor unit makes it particularly easy to determine whether a ground interruption of one of the ground lines is present. If no ground interruption is present, then a voltage value of the bridge voltage corresponds at least essentially to an expected normal voltage value. However, if the voltage value of the bridge voltage deviates from the normal voltage value by more than a predefined voltage threshold value, then the evaluation unit determines that a ground interruption of one of the ground lines is present. Depending on whether the voltage value of the bridge voltage undershoots or exceeds the normal voltage value, the evaluation determines which one of the ground lines is affected by the ground interruption.

The XMR sensor is preferably integrated into the control unit. The XMR sensor thus is situated within the housing of the control unit. The housing therefore protects the XMR sensor.

According to this preferred embodiment of the present invention, it is provided that the XMR sensor is developed without a flux concentrator. This further reduces the space requirement of the sensor device.

The XMR sensor is preferably developed as a GMR sensor or as a TMR sensor. In such a design of the XMR sensor, the change in the resistances of the resistor elements is particularly pronounced. It is therefore not necessary to provide amplifiers between the conductors and the analog-to-digital converters. As an alternative, the XMR sensor is preferably developed as an AMR sensor, a CMR sensor, or an EMR sensor.

A motor vehicle according to an example embodiment of the present invention includes the system according to example embodiment(s) of the present invention. This, too, provides the already mentioned advantages. Further preferred features and feature combinations result from the description herein and the figures. In an especially preferred manner, as the control operation, the control unit is designed to control a parking operation of the motor vehicle in a fully automated manner. The ground connection preferably is a ground connection of a chassis ground of the motor vehicle or a ground connection of a battery ground of an electrical energy store of the motor vehicle.

The present invention is described in greater detail below with the aid of the figures.

DETAILED DESCRIPTION OF EXAMPLE EMBODIMENTS

Figure 1:
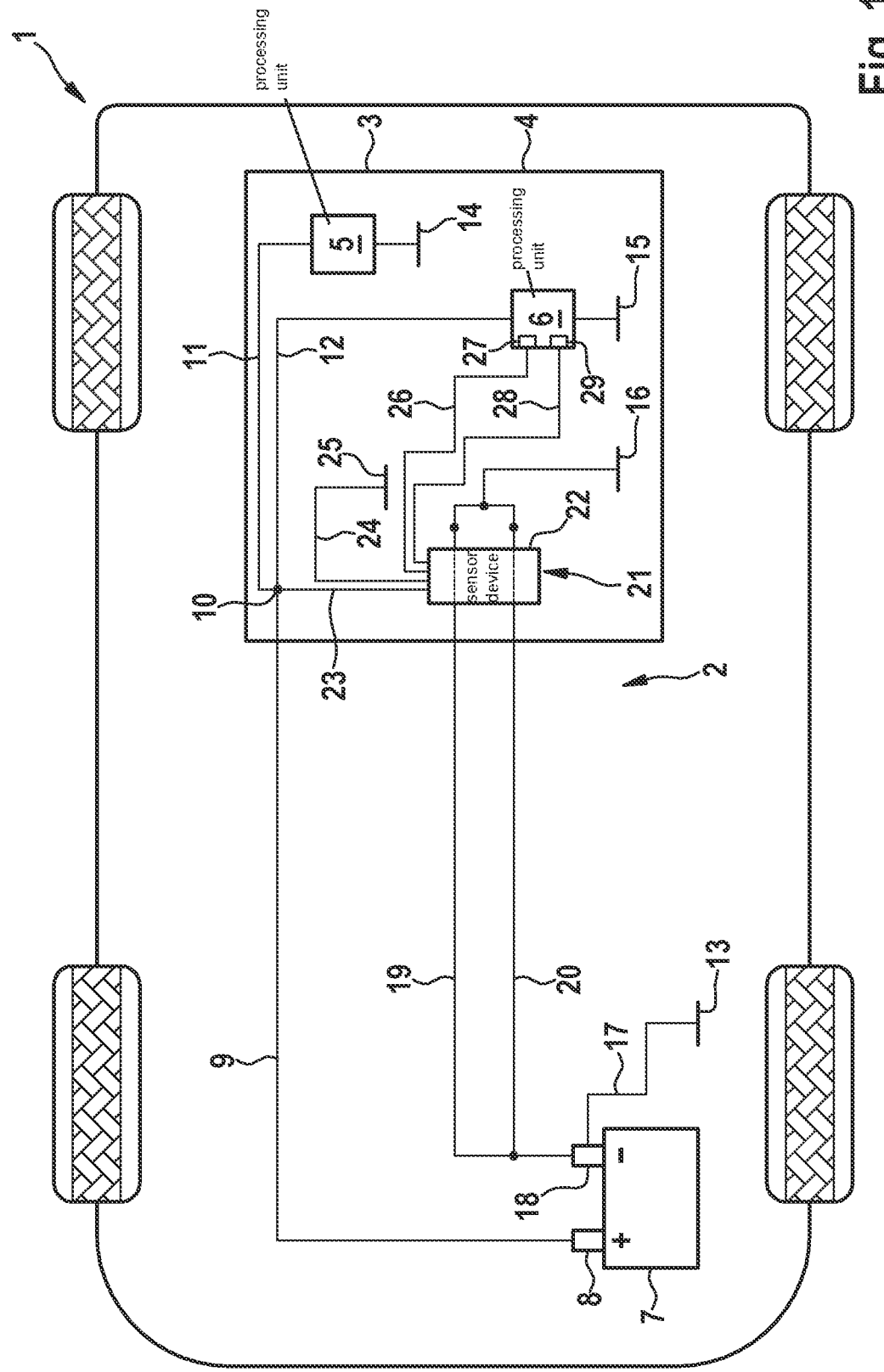
FIG. 1 shows a motor vehicle having a system, in accordance with an example embodiment of the present invention.

FIG. 1 shows a motor vehicle 1 having a system 2 in a simplified representation. System 2 has a control unit 3.

Control unit 3 includes a housing 4 in which a plurality of processing units 5, 6 is disposed. Processing units 5 and 6 have at least one electronic circuit in each case.

Processing unit 5 involves a main processing unit of control unit 3. Processing unit 5 is developed to carry out a fully automated parking operation of motor vehicle 1 as a control operation. To this end, for signaling purposes, processing unit 5 is connected to an environment sensor system of motor vehicle 1, a steering system of motor vehicle 1, a drive device of motor vehicle 1, and to a brake system of motor vehicle 1, and it is developed to actuate the steering system, the drive device and the brake system as a function of the environment data acquired with the aid of the environment sensor system.

System 2 has an electrical energy store 7. Energy store 7 is situated outside housing 4. A positive terminal 8 of energy store 7 is electrically connected via a line 9 to a supply connection 10 of control unit 3. In order to supply processing units 5 and 6 with electrical energy, processing units 5 and 6 are electrically connected to supply connection 10 by lines 11 and 12.

In addition, processing units 5 and 6 are electrically connected to a ground node 14 and 15 of control unit 3. Ground nodes 14 and 15 are electrically connected to a star ground 16 of control unit 3. Star ground 16 is situated within housing 4 of control unit 3.

Moreover, system 2 has an electrical ground connection 13, which is part of a chassis ground of motor vehicle 1. To this extent, ground connection 13 is able to be managed separately to control unit 3 and is situated outside housing 4. Ground connection 13 is electrically connected via a line 17 to a battery ground 18 of energy store 7. In order to discharge electrical currents from processing units 5 and 6, processing units 5 and 6 are electrically connected to ground connection 13 with the aid of battery ground 18. System 2 has a first ground line 19 and a second ground line 20 for this purpose.

On the one hand, first ground line 19 is electrically connected to star ground 16, and on the other hand it is electrically connected to battery ground 18. Second ground line 20 is also electrically connected to star ground 16 on the one hand and electrically connected to battery ground 18 on the other hand. Ground lines 19 and 20 extend regionally outside of housing 4. Ground lines 19 and 20 are connected in parallel with each other to star ground 16 and are connected in parallel with each other to battery ground 18, which means that ground lines 19 and 20 as a whole are switched in parallel with one another. Through ground lines 19 and 20, processing units 5 and 6 of control unit 3 are therefore connected to ground connection 13 in a redundant manner.

In addition, system 2 has a sensor device 21, which is situated inside housing 4 and thus is integrated into control unit 3. Sensor device 21 is developed to monitor a first ground current flowing through first ground line 19 and to monitor a second ground current flowing through second ground line 20. It is assumed here that the ground currents are flowing from star ground 16 to ground connection 13 in a normal operation of control unit 3. To monitor the ground currents, sensor device 21 has an XMR sensor 22. XMR sensor 22 is a GMR sensor 22 in this instance. As an alternative, XMR sensor 22 is preferably a TMR sensor, a CMR sensor, an EMR sensor, or an AMR sensor.

XMR sensor 22 is electrically connected via a supply line 23 to supply connection 10 and thus is connected to positive terminal 8 of energy store 7. In addition, XMR sensor 22 is electrically connected via a line 24 to a further ground node 25 of control unit 3. Further ground node 25 is electrically connected to star ground 16 as well. Moreover, XMR sensor 22 is connected via a first signal line 26 to a first analog-to-digital converter 27 of processing unit 6, and by a second signal line 28 to a second analog-to-digital converter 29 of processing unit 6.

Figure 2:
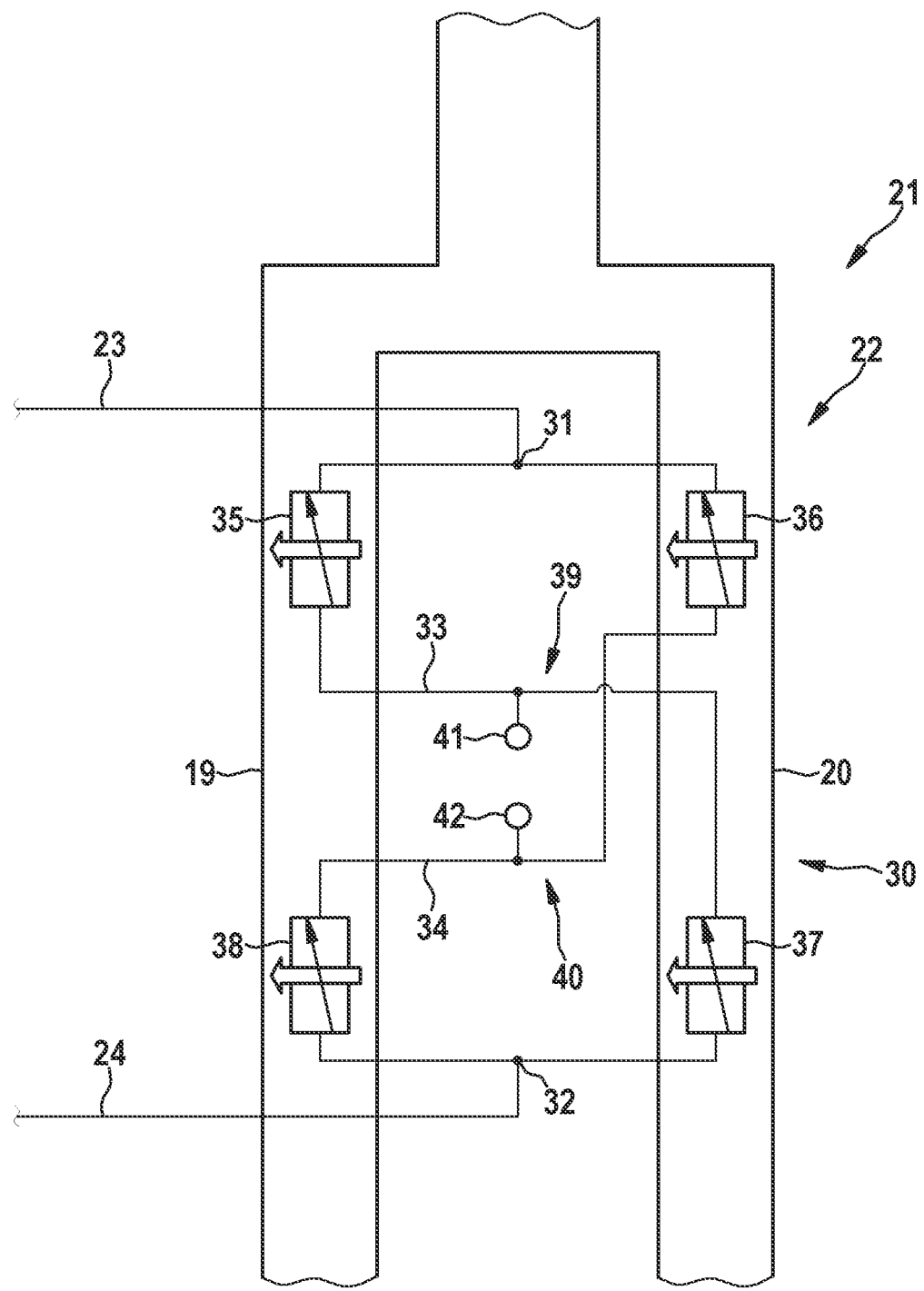
FIG. 2 shows a detail view of a sensor device of the system, in accordance with an example embodiment of the present invention.

In the following text, the design of sensor device 21 will be described in greater detail with reference to FIG. 2. As may be gathered from FIG. 2, XMR sensor 22 has a measuring bridge 30. Measuring bridge 30 has an input 31 and an output 32. With the aid of supply line 23, input 31 is electrically connected to supply connection 10. With the aid of line 24, output 32 is electrically connected to further ground node 25. A potential difference between input 31 and output 32 is denoted as the supply voltage.

Measuring bridge 30 additionally has a first conductor 33 and a second conductor 34. First conductor 33 and second conductor 34 are electrically connected in parallel with each other to input 31. In addition, first conductor 33 and second conductor 34 are electrically connected in parallel with each other to output 32.

First conductor 33 has a first magnetoresistive resistor element 35 adjacent to input 31. Second conductor 34 has a second magnetoresistive resistor element 36 adjacent to input 31. First conductor 33 has a third magnetoresistive resistor element 37 adjacent to output 32. Second conductor 34 has a fourth magnetoresistive resistor element 38 adjacent to output 32. Because XMR sensor 22 is developed as a GMR sensor 22, resistor elements 35, 36, 37, and 38 are developed as GMR elements 35, 36, 37, and 38.

In this instance, resistor elements 35, 36, 37, and 38 are developed as a resistor element or GMR element of the spin valve type in each case. To this extent, resistor elements 35, 36, 37, and 38 each have at least one magnetically soft layer and at least one magnetically hard layer.

If XMR sensor 22 is developed as a TMR sensor, an AMR sensor, a CMR sensor or an EMR sensor, then each resistor element 35, 36, 37, and 38 is preferably developed as a TMR element, an AMR element, a CMR element, or an EMR element of the spin valve type.

First conductor 33 has a first section 39, which is situated between first resistor element 35 and third resistor element 37. Second conductor 34 has a second section 40, which is situated between second resistor element 36 and fourth resistor element 38. A potential difference between first section 39 and second section 40 is denoted as the bridge voltage. First section 39 has a first connection 41 to which first signal line 26 is connected. Second section 40 has a second connection 42 to which second signal line 28 is connected. Therefore, an electrical potential of first section 39 and an electrical potential of second section 40, and thus the bridge voltage, are supplied to processing unit 6 via signal lines 26 and 28.

A change in the first ground current flowing through first ground line 19 causes a change in a first magnetic field surrounding the first ground line. Accordingly, a change in the second ground current flowing through the second ground line causes a change in a second magnetic field surrounding the second ground line.

First resistor element 35 and fourth resistor element 38 are situated adjacent to first ground line 19 in such a way that a change in the first magnetic field causes a change in an electrical resistance of first resistor element 35 and a change in the electrical resistance of fourth resistor element 38. First resistor element 35 and fourth resistor element 38 are thus allocated to first ground line 19. In this case, resistor elements 35 and 38 are developed in such a way that an increase in the first ground current induces a reduction of the resistances of resistor elements 35 and 38.

Second resistor element 36 and third resistor element 37 are situated adjacent to second ground line 20 in such a way that a change in the second magnetic field causes a change in an electrical resistance of second resistor element 36 and a change in an electrical resistance of third resistor element 37. Second resistor element 36 and third resistor element 37 are therefore allocated to second ground line 20. In this instance, resistor elements 36 and 37 are developed in such a way that an increase in the second ground current causes a reduction of the resistances of resistor elements 36 and 37.

Processing unit 6 as evaluation unit 6 is developed to determine as a function of the bridge voltage whether one of ground lines 19 or 20 has a ground interruption. If one of ground lines 19 or 20 has a ground interruption, then star ground 16 is no longer electrically connected to ground connection 13 by affected ground line 19 or 20 so that no ground current is able to flow through ground line 19 or 20.

If no ground interruption exists, then a voltage value of the bridge voltage corresponds at least essentially to an expected normal voltage value. As a rule, the normal voltage value corresponds to 0 V. Processing unit 6 therefore determines that no ground interruption is present if the voltage value of the bridge voltage corresponds at least essentially to the normal voltage value.

If a ground interruption of first ground line 19 is present, then the resistances of resistor elements 36 and 37 are lower than the resistances of resistor elements 35 and 38. As a result, the voltage value of the bridge voltage is reduced in comparison with the normal voltage value. Processing unit 6 is therefore developed to determine that a ground interruption of first ground line 19 is present if the voltage value of the bridge voltage is reduced in comparison with the normal voltage value.

If a ground interruption of second ground line 20 is present, then the resistances of resistor elements 35 and 38 are lower than the resistances of resistor elements 36 and 37. As a result, the voltage value of the bridge voltage is higher in comparison with the normal voltage value. Processing unit 6 is therefore developed to determine that a ground interruption of second ground line 20 is present if the voltage value of the bridge voltage has increased in comparison with the normal voltage value.

Processing unit 6 is preferably developed to block the function of processing unit 5, that is to say, the execution of parking operations, when a ground interruption of one of ground lines 19 or 20 is present.

What is claimed is:

1. A system, comprising:
a control unit, which has a housing in which at least one processing unit of the control unit is situated;
an electrical ground connection situated outside the housing;
a first ground line by which the control unit and the ground connection are electrically connected;
a second ground line by which the control unit and the ground connection are electrically connected; and
a sensor device which is configured to monitor an electrical first ground current flowing through the first ground line and an electrical second ground current flowing through the second ground line, the sensor device including an XMR sensor for monitoring the first and the second ground current, wherein:
the XMR sensor has a measuring bridge which includes a first, a second, a third, and a fourth magnetoresistive resistor element, and
the measuring bridge has a first conductor and a second conductor, the first and the second conductors being electrically connected in parallel with each other to an input of the measuring bridge and being electrically connected in parallel with each other to an output of the measuring bridge, the first conductor having the first resistor element adjacent to the input and having the third resistor element adjacent to the output, and the second conductor having the second resistor element adjacent to the input and having the fourth resistor element adjacent to the output.

2. The system as recited in claim 1, wherein the resistor elements are identically designed.

3. A system, comprising:
a control unit, which has a housing in which at least one processing unit of the control unit is situated;
an electrical ground connection situated outside the housing;
a first ground line by which the control unit and the ground connection are electrically connected;
a second ground line by which the control unit and the ground connection are electrically connected; and
a sensor device which is configured to monitor an electrical first ground current flowing through the first ground line and an electrical second ground current flowing through the second ground line, the sensor device including an XMR sensor for monitoring the first and the second ground current, wherein:
the XMR sensor has a measuring bridge which includes a first, a second, a third, and a fourth magnetoresistive resistor element, and
an evaluation unit which is configured to acquire a bridge voltage of the measuring bridge and to determine as a function of the bridge voltage whether the first and/or the second ground line has a ground interruption.

4. A system, comprising:
a control unit, which has a housing in which at least one processing unit of the control unit is situated;
an electrical ground connection situated outside the housing;
a first ground line by which the control unit and the ground connection are electrically connected;
a second ground line by which the control unit and the ground connection are electrically connected; and
a sensor device which is configured to monitor an electrical first ground current flowing through the first ground line and an electrical second ground current flowing through the second ground line, the sensor device including an XMR sensor for monitoring the first and the second ground current, wherein:
the XMR sensor has a measuring bridge which includes a first, a second, a third, and a fourth magnetoresistive resistor element, and
wherein the first and the fourth resistor element are situated adjacent to the first ground line in such a way that a resistance of the first resistor element and a resistance of the fourth resistor element is affected by a change in the first ground current, and the second and the third resistor element are situated adjacent to the second ground line in such a way that a resistance of the second resistor element and a resistance of the third resistor element are affected by a change in the second ground current.

5. The system as recited in claim 4, wherein the first and the fourth resistor element are configured in such a way that a change in the first ground current affects the resistance of the first and the fourth resistor element to the same degree, and that the second and the third resistor element are developed in such a way that a change in the second ground current affects the resistance of the second and the third resistor element to the same degree.

6. The system as recited in claim 1, wherein the XMR sensor is integrated into the control unit.

7. The system as recited in claim 1, wherein the XMR sensor is developed without a flux concentrator.

8. The system as recited in claim 1, wherein the XMR sensor is a GMR sensor or a TMR sensor.

9. A motor vehicle, comprising:
   a system including:
     a control unit, which has a housing in which at least one processing unit of the control unit is situated;
     an electrical ground connection situated outside the housing;
     a first ground line by which the control unit and the ground connection are electrically connected;
     a second ground line by which the control unit and the ground connection are electrically connected; and
     a sensor device which is configured to monitor an electrical first ground current flowing through the first ground line and an electrical second ground current flowing through the second ground line, the sensor device including an XMR sensor for monitoring the first and the second ground current, wherein:
     the XMR sensor has a measuring bridge which includes a first, a second, a third, and a fourth magnetoresistive resistor element, and
     the measuring bridge has a first conductor and a second conductor, the first and the second conductors being electrically connected in parallel with each other to an input of the measuring bridge and being electrically connected in parallel with each other to an output of the measuring bridge, the first conductor having the first resistor element adjacent to the input and having the third resistor element adjacent to the output, and the second conductor having the second resistor element adjacent to the input and having the fourth resistor element adjacent to the output.

\* \* \* \* \*